United States Patent
Perner et al.

(10) Patent No.: US 6,545,711 B1
(45) Date of Patent: Apr. 8, 2003

(54) PHOTO DIODE PIXEL SENSOR ARRAY HAVING A GUARD RING

(75) Inventors: Frederick A. Perner, Palo Alto, CA (US); Min Cao, Mountain View, CA (US); Charles M. C. Tan, Santa Clara, CA (US); Jeremy A. Theil, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/184,426

(22) Filed: Nov. 2, 1998

(51) Int. Cl.⁷ .................. H04N 5/335; H01L 31/00; H01L 29/768
(52) U.S. Cl. ................... 348/294; 257/459; 257/233
(58) Field of Search ............... 348/294, 241, 348/302, 308, 310, 245; 257/229, 443, 446, 291, 173, 357, 458, 459

(56) References Cited

U.S. PATENT DOCUMENTS

| | | | | |
|---|---|---|---|---|
| 5,535,084 A | * | 7/1996 | Nakayama | 257/356 |
| 5,548,152 A | * | 8/1996 | Arai | 257/360 |
| 5,627,850 A | * | 5/1997 | Irwin et al. | 257/14 |
| 5,689,132 A | * | 11/1997 | Ichikawa | 257/357 |
| 5,751,049 A | * | 5/1998 | Goodwin | 257/443 |
| 5,859,450 A | * | 1/1999 | Clark et al. | 257/233 |
| 5,895,940 A | * | 4/1999 | Kim | 257/173 |
| 6,018,187 A | * | 1/2000 | Theil et al. | 257/458 |
| 6,060,763 A | * | 5/2000 | Yamagishi et al. | 257/577 |
| 6,096,618 A | * | 8/2000 | Dunn et al. | 257/409 |
| 6,229,192 B1 | * | 5/2001 | Gu | 257/458 |

FOREIGN PATENT DOCUMENTS

JP      401054761 A    *    3/1989      H01L/29/48

OTHER PUBLICATIONS

McNutt, MJ., Edge leakage control in platinum–silicide Schottky–barrier diodes used for infrared detection, Aug. 1988, IEE vol.: 9 Issue:8, on p.: 394–396.*

Harai et al., Numerical simulation of avalanche photodiodes with guard ring, Jun. 1991, IEE vol.: 138 Issue:3, on p.:211 217.*

* cited by examiner

Primary Examiner—Wendy R. Garber
Assistant Examiner—Lin Ye

(57) ABSTRACT

An image sensor array. The image sensor array includes a substrate. An array of photo diode sensors are electrically interconnected to the substrate. The photo diode sensors conduct charge at a rate proportional to the intensity of light received by the photo diode sensors. A ring of guard diodes are located around the periphery of the array of photo diode sensors. Each guard diode has a guard diode anode connected to a predetermined guard anode voltage and a guard diode cathode connected to a static guard cathode voltage.

9 Claims, 3 Drawing Sheets

US 6,545,711 B1

PHOTO DIODE PIXEL SENSOR ARRAY HAVING A GUARD RING

FIELD OF INVENTION

This invention relates generally to an array of photo diode sensors. In particular, it relates to an array of photo diode sensors which include a ring of guard diodes around the periphery of the array.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power.

Historically, image sensors have predominantly been charged coupled devices (CCDs). CCDs are relatively small and can provide a high-fill factor. However; CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a cross-section of an array of photo diode sensors. The array is formed on a substrate 10. The array includes photo diode sensors 12, 14, 16. Cathodes of the photo diode sensors 12, 14, 16 are electrically connected to the substrate 10. Anodes of the photo diode sensors 12, 14, 16 are electrically connected to a transparent conductive layer 18. The transparent conductive layer 18 is electrically connected to a bias voltage which ensures that the photo diode sensors 12, 14, 16 are reverse biased.

FIG. 2 is a schematic of a typical circuit included on the substrate 10 which is electrically connected to each photo diode sensor 12, 14, 16. The circuit includes a switch 22 which drives the cathode of each photo diode sensor 12, 14, 16 to an initial cathode voltage and charges a cathode capacitor 24. The switch 22 is subsequently opened and the cathode capacitor 24 discharges as the photo diode sensor connected to the cathode capacitor 24 conducts charge. The rate in which the cathode capacitor 24 discharges is dependent upon the intensity of light received by the photo diode sensor connected to the cathode capacitor 24. Therefore, the intensity of light received by the photo diode sensor can be determined by sampling the voltage on the cathode capacitor 24 a period of time after the switch 22 has been opened.

The charge conducted by a reverse biased diode is generated in the space charge region and neutral region of the diode. Photodiode sensors are configured so that the charge conducted by a reverse biased photo diode sensor is generated in the space charged region. The magnitude of the charge conducted is directly dependent on the volume of the space charged region. In an array of photo diode sensors, the space charged region of each photo diode sensor extends beyond the physical boundaries of the photo diode sensor. The space charged region is defined by the electric field between the anode and the cathode of the photo diode sensor.

FIG. 1 includes arrows within each photo diode sensor 12, 14, 16 which depict the electric field between the anode and the cathode of each photo diode sensor 12, 14, 16. Each of the photo diode sensor 12, 14, 16 are biased the same way. That is, the anodes and the cathodes of all the photo diode sensor 12, 14, 16 within the array are biased with approximately the same voltage potentials.

The photo diode sensors 14, 16 which are within the interior of the array of photo diode sensors, include electric fields which are approximately symmetrical around the photo diode sensor. Therefore, the interior photo diode sensors 14, 16 conduct approximately the same amount of charge when exposed to uniform illumination or light. However, the photo diode sensor 12 at the edge of the array is not surrounded by a symmetrical electric field. The amount of charge conducted by the edge photo diode sensor 12 when exposed to the same uniform illumination is greater than the charge conducted by the interior photo diode sensors 14, 16 because of the non-symmetric electric field surrounding the edge photo diode sensor 12.

All edge diodes of an array of photo diode sensors, like the edge diode 12, include non-symmetric electric fields. Therefore, the edge diodes of an array of photo diode sensors do not conduct the same amount of charge as interior photo diode sensors of the array when exposed to uniform illumination. Additionally, the non-symmetric electric fields of the edge diodes can influence of the electric fields of the interior photo diode sensors.

It is desirable to have an array of photo diode sensors in which photo diode sensors at the edge of the array include symmetric electric fields, and conduct the same amount of charge as interior photo diode sensors when exposed to uniform light. It is desirable that diodes at the edge of the array of photo diodes have electric fields that do not influence the electric fields of the interior photo diode sensors. Additionally, it is desirable that the array of photo diode sensors be manufacturable without adding extra processing and fabrication steps.

SUMMARY OF THE INVENTION

The present invention is an image sensor array. The image sensor array includes photo diode sensors in which photo diode sensors at the edge of the array have symmetric electric fields, and conduct the same amount of charge as interior photo diode sensors when exposed to uniform light. The array of photo diode sensors are manufacturable without adding extra processing and fabrication steps.

A first embodiment of this invention includes an image sensor array. The image sensor array includes a substrate. An array of photo sense diodes are electrically interconnected to the substrate. The photo sense diodes conduct charge at a rate proportional to the intensity of light received by the photo sense diodes. A ring of guard diodes is located around the periphery of the array of photo sense diodes. Each guard diode has a guard diode anode connected to a predetermined anode voltage and a guard diode cathode connected to a static guard cathode voltage.

A second embodiment is similar to the first embodiment. The second embodiment further includes the static guard cathode voltage being a predetermined constant voltage. The predetermined constant voltage is selected so that a guard voltage potential across each guard diode is equal to an average of sense voltages between anodes and cathodes of the photo sense diodes.

A third embodiment is similar to the first embodiment. The third embodiment includes the photo sense diodes and the guard diodes being PIN diodes.

Other aspects and advantages of the present invention will become apparent from the following detailed description, taken in conjunction with the accompanying drawings, illustrating by way of example the principles of the invention.

DETAILED DESCRIPTION

Figure 1:
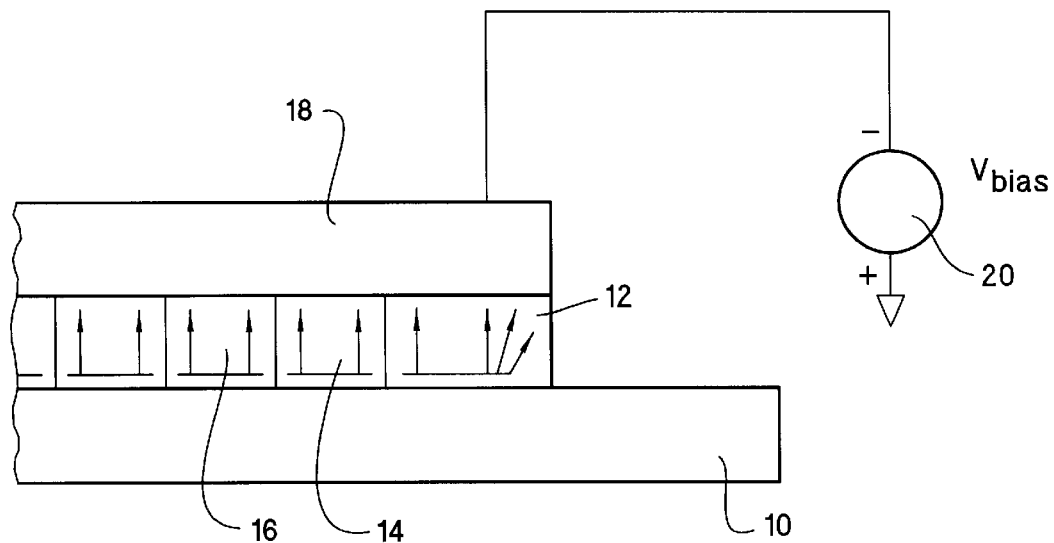
FIG. 1 shows a cross-section of an array of photo diode sensors.

As shown in the drawings for purposes of illustration, the invention is embodied in an image sensor array including photo diode sensors in which photo diode sensors at the edge of the array have symmetric electric fields, and conduct the same amount of charge as interior photo diode sensors when exposed to uniform light. The array of photo diode sensors are manufacturable without adding extra processing and fabrication steps.

Figure 3:
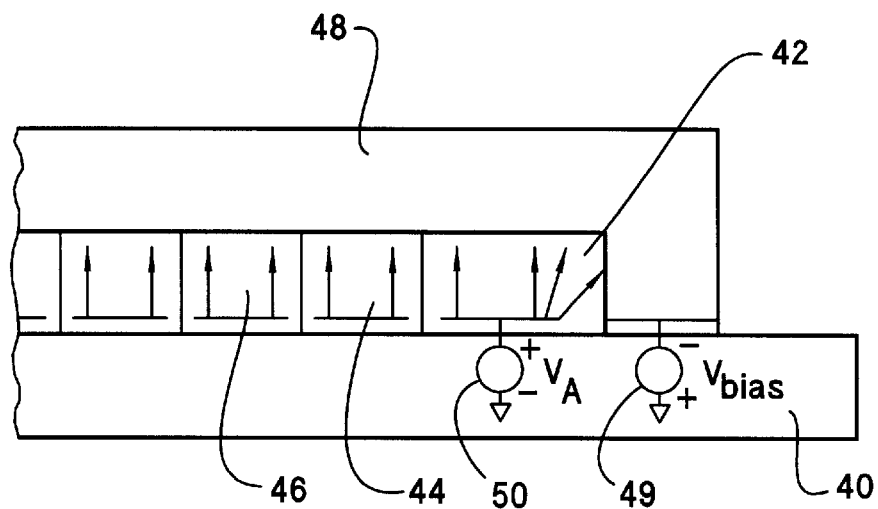
FIG. 3 shows an embodiment of the invention.

FIG. 3 shows an embodiment of the invention. This embodiment includes a substrate 40. An array of photo diode sensors including photo diode sensors 42, 44, 46 are formed over the substrate 40. Cathodes of photo diode sensors 42, 44, 46 are electrically connected to the substrate 40. Anodes of the photo diode sensors 42, 44, 46 are electrically connected to a transparent conductive layer 48. The transparent conductive layer 48 is electrically connected to an anode voltage bias source 49 on the substrate 40. The cathode of a guard photo diode sensor 42 is electrically connected to a guard cathode voltage source 50. The photo diode sensor 44 is at the edge of the array of photo diode sensors.

The invention includes a plurality of guard photo diode sensors like the guard photo diode sensor 42. The guard photo diode sensors are formed at the periphery of the array of photo diode sensors. All edge photo diode sensors are adjacent to either another photo diode sensor of the array of photo diode sensors, or one of the guard photo diode sensor surrounding the array of photo diode sensors. The cathodes of the guard photo diode sensors are electrically connected to the guard cathode voltage source 50.

Figure 4:
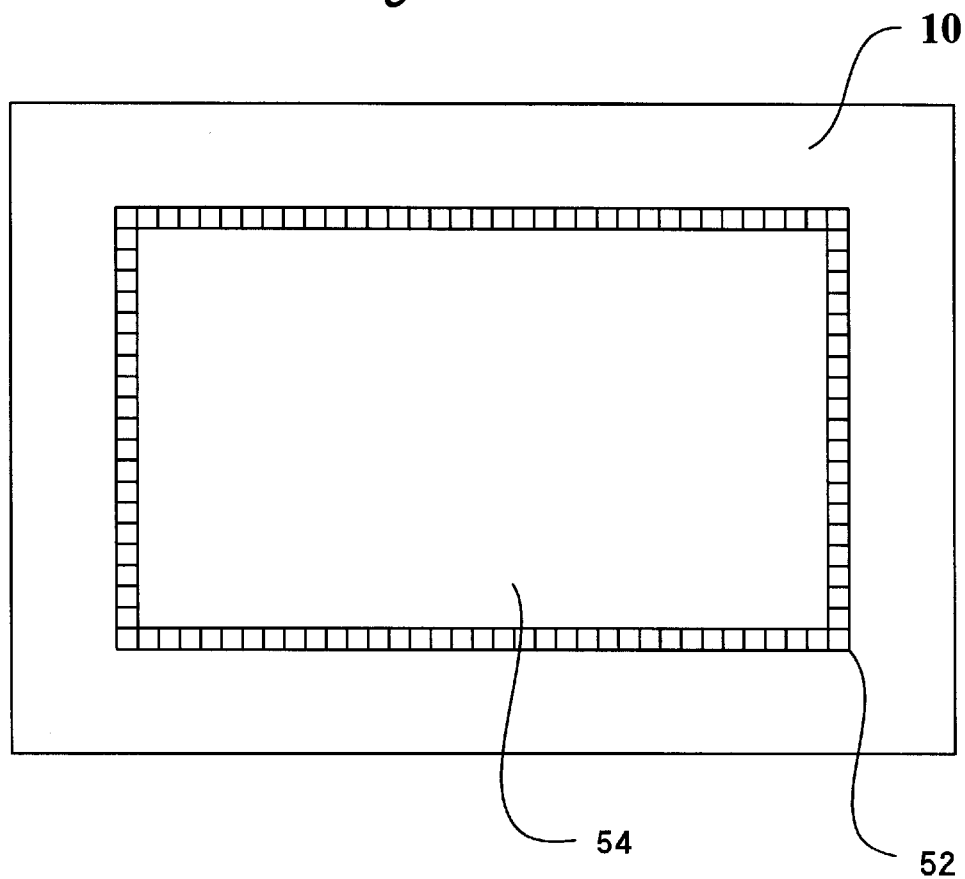
FIG. 4 shows a top view of an array of photo diode sensors and guard photo diode sensors.

FIG. 4 shows a top view of an array of photo diode sensors 54 and guard photo diode sensors 52. As previously described, the guard photo diode sensors 52 are formed around the periphery of the array of photo diode sensors 54. The edge photo diode sensors are the photo diode sensors of the array of photo diode sensors 54 which are adjacent to the guard photo diode sensors 52.

The guard cathode voltage source 50 provides the capability to adjust and manipulate the electric fields surrounding the guard photo diode sensors. Proper adjustment of the guard cathode voltage source 50 creates symmetric electric fields surrounding the edge photo diode sensors of the array of photo diode sensors. With symmetric electric fields surrounding the edge photo diode sensors, the edge photo diode sensors conduct approximately the same amount of charge as the as photo diode sensors which are located at the interior of the array of photo diode sensors when receiving the same intensity of light.

The guard photo diode sensors are formed the same way the photo diode sensors of the array of photo diode sensors. The only variation between the guard photo diode sensors and the photo diode sensors of the array of photo diode sensors, is the circuitry located on the substrate 40 which drives the cathodes of the guard photo diode sensors and the photo diode sensors. Therefore, the invention does not require any extra processing steps to manufacture.

As was previously stated, the anodes of the guard photo diode sensors are electrically connected to the anode voltage bias source 49 on the substrate 40. The cathodes of the guard photo diode sensors are electrically connected to the guard cathode voltage source 50. The anodes of the photo diode sensors of the array photo diode sensors are also connected to the anode voltage bias source 49 on the substrate 40. However, the cathodes of the photo diode sensors of the array photo diode sensors are each electrically connected to a circuit similar to the circuit shown in FIG. 2.

Figure 2:
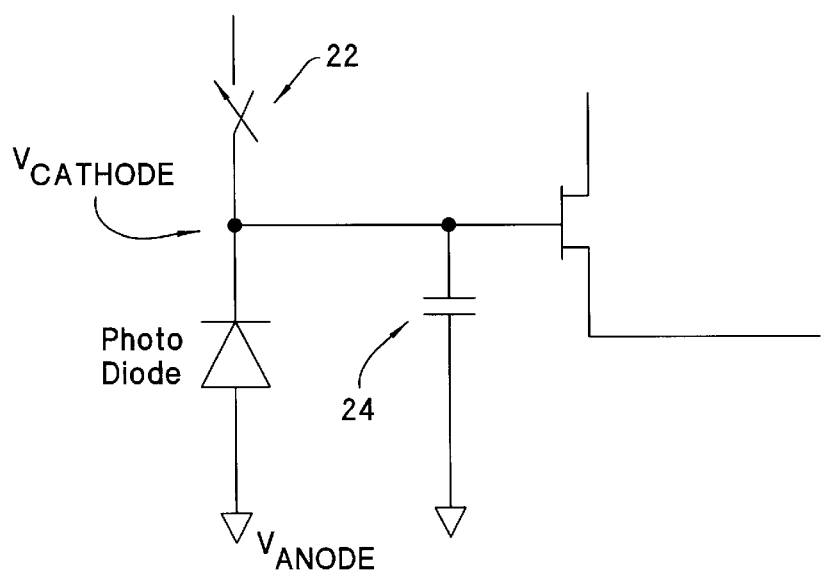
FIG. 2 is a schematic of a typical circuit included on the substrate which is electrically connected to each photo diode sensor.

The circuit of FIG. 2 includes a switch 22 which drives the cathode of each photo diode sensor to an initial cathode voltage which charges a cathode capacitor 24. The switch 22 is subsequently opened and the cathode capacitor 24 discharges as the photo diode sensor connected to the cathode capacitor 24 conducts charge. The rate in which the cathode capacitor 24 discharges is dependent upon the intensity of light received by the photo diode sensor connected to the cathode capacitor 24. Therefore, the intensity of light received by the photo diode sensor can be determined by sampling the voltage on the cathode capacitor 24 a period of time after the switch 22 has been opened.

Figure 5:
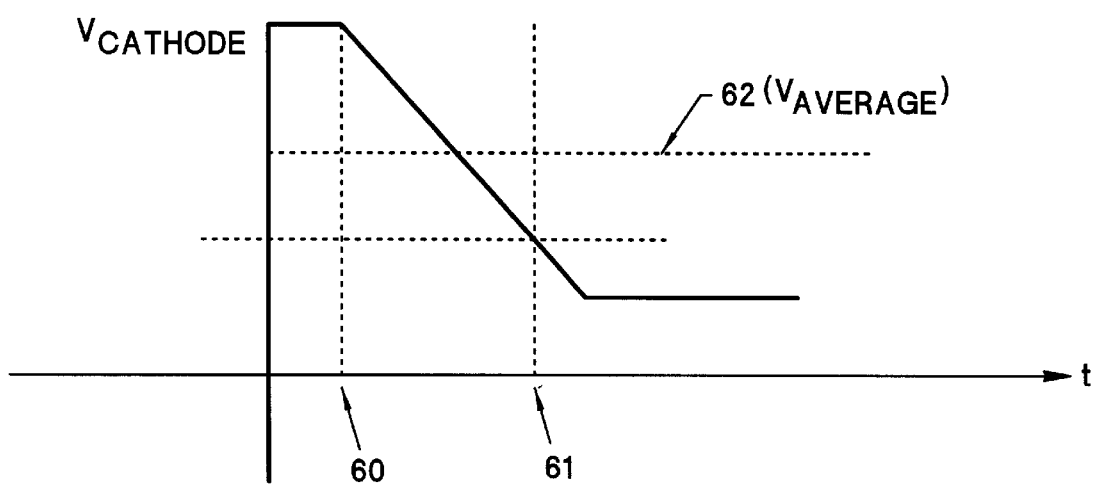
FIG. 5 is a plot which represents the cathode voltage of interior photo diode sensors.

FIG. 5 is a plot which approximately represents the cathode voltage of each of the photo diode sensors which are driven by an electronic circuit similar to the circuit shown in FIG. 2. The switch 22 of the circuit is opened at time 60. The cathode voltage of each photo diode sensor then decreases as the cathode capacitor 24 discharges as the photo diode sensor connected to the cathode capacitor 24 conducts charge. The cathode voltage is sampled at time 61. The greater the intensity of received light, the lower the cathode voltage is at the time 61 that the cathode voltage is sampled.

A dashed line 62 shows an average cathode voltage which can be calculated from the plot shown in FIG. 4. The calculated average voltage is the average cathode voltage between the time 60 that the cathode voltage is allowed to change, and the time 61 that the cathode voltage is sampled. The calculated average cathode voltage can be used to determine the voltage potential to set the guard cathode voltage source 50. By setting the guard cathode voltage source 50 to a voltage potential equal to the average voltage potential across the photo diode sensors of the array, the electric fields surrounding the guard photo diode sensors are approximately the same as the electric fields surrounding the photo diode sensors of the array.

An alternate approach includes "dummy" rows and columns of diodes surrounding the array of photo diode sensors. The dummy rows and columns provide a structure which eliminates some of the effects of the diodes at the edge of the array of photo diode sensors. However, providing complete rows and columns is unnecessary for the photo diode array where the effect that needs to be controlled is the electric field and the electric field is simply controlled by a simple ring structure.

The guard ring structure of this invention is effective in shaping the electric field of the edge photo diodes without requiring complex physical structures that increase the cost and reliability of the array of photo diode sensors.

Another embodiment of the invention includes the photo diode sensors being formed from thin film photo-detectors. More precisely, the photo diode sensors can be formed from amorphous silicon PIN diodes.

Although specific embodiments of the invention have been described and illustrated, the invention is not to be limited to the specific forms or arrangements of parts so described and illustrated. The invention is limited only by the claims.

What is claimed:

1. An image sensor array comprising:

a substrate;

an array of photo diode sensors electrically interconnected to the substrate, the photo diode sensors conducting charge at a rate proportional to the intensity of light received by the photo diode sensors; and a ring of guard diodes located around the periphery of the array of photo diode sensors, each guard diode having a guard diode anode connected to a predetermined anode voltage and a guard diode cathode connected to a static guard cathode voltage.

2. The image sensor array as recited in claim 1, wherein the static guard cathode voltage is a predetermined constant voltage.

3. The image sensor array as recited in claim 1, wherein the photo diode sensors comprise PIN diodes.

4. The image sensor array as recited in claim 1, wherein the guard diodes comprise PIN diodes.

5. The image sensor array as recited in claim 1, wherein the sensor array further comprises a transparent conductive layer formed over the array which electrically interconnects anodes of the photo diode sensors and anodes of the guard diodes to a fixed anode voltage.

6. The image sensor array as recited in claim 2, wherein the predetermined constant voltage is selected so that a guard voltage potential across each guard diode is equal to an average of sense voltages between anodes and cathodes of the photo diode sensors.

7. The image sensor array as recited in claim 6, wherein the guard voltage potential across each guard diode is adjusted by adjusting the predetermined cathode voltage.

8. The image sensor array as recited in claim 1, wherein the photo diode sensors and the guard diodes comprise thin film photo-detectors.

9. The image sensor array as recited in claim 8, wherein the photo diode sensors and the guard diodes comprise amorphous silicon.

* * * * *